United States Patent [19]

Powell

[11] Patent Number: 5,367,205
[45] Date of Patent: Nov. 22, 1994

[54] HIGH SPEED OUTPUT BUFFER WITH REDUCED VOLTAGE BOUNCE AND NO CROSS CURRENT

[75] Inventor: Stanley J. Powell, Boise, Id.

[73] Assignee: Micron Semiconductor, Inc., Boise, Id.

[21] Appl. No.: 61,607

[22] Filed: May 13, 1993

[51] Int. Cl.⁵ .......................................... H03K 19/003
[52] U.S. Cl. ........................................ 326/27; 326/82; 326/57
[58] Field of Search ................. 307/443, 425, 263, 473

[56] References Cited

U.S. PATENT DOCUMENTS

| | | | |
|---|---|---|---|
| 4,103,188 | 7/1978 | Morton | 307/570 |
| 4,818,901 | 4/1989 | Young et al. | 307/443 X |
| 5,036,232 | 7/1991 | Jungert et al. | 307/443 X |
| 5,057,711 | 10/1991 | Lee et al. | 307/443 |
| 5,118,971 | 6/1992 | Schenck | 307/443 |
| 5,124,579 | 6/1992 | Naghshima | 307/443 |

*Primary Examiner*—David R. Hudspeth
*Attorney, Agent, or Firm*—Angus C. Fox, III

[57] ABSTRACT

There is an output buffer which reduces the amount of voltage bounce occurring during the switching of the outputted signal. Uniquely, there is an output buffer/driver which turns on either driver transistor by progressively increasing the voltage on the control gates in a series of steps. Additionally, and simultaneously, the complementary signal is turned off immediately to prevent any possibility of creating current crossing in the output driver. Additionally, the invention has the advantage of avoiding cross current from occurring during switching of the output signals.

9 Claims, 1 Drawing Sheet

HIGH SPEED OUTPUT BUFFER WITH REDUCED VOLTAGE BOUNCE AND NO CROSS CURRENT

FIELD OF THE INVENTION

The present invention relates to integrated circuits (ICs). Particularly, there is an output buffer which reduces the amount of voltage bounce occurring during the switching of the outputted signal. Uniquely, there is an output buffer/driver which provides faster switching signal switching without creating current crossing in the output driver.

BACKGROUND OF THE INVENTION

Digital logic, in the form of integrated circuits, has found wide spread use in virtually every type of electronic system. The interface function is a basic function of any electronic system; it allows the logic of one IC device to interface with other devices. One important component for this interface function is the output buffer which, when enabled, provides an output which is a function of data received from other logic circuitry of the IC.

FIG. 1 shows a related art CMOS output buffer 10 which provides an output signal at output line 18 based upon a DATA signal received at data input terminal 4 and an ENABLE signal received at enable input line 6. Output buffer 10 includes NAND gates 8 and 21, inverters 23, 25, 27, and 29, and a P-channel FET 14 and an N-channel FET 16. Power for all of the components of the output buffer 10 is provided by first and second power supply terminals Vcc (full voltage from the power supply) 15, and ground 17.

In operation, the main point to understand is that transistors 14 and 16 are large in order to provide enough current to communicate to other devices receiving output signals from the output buffer (or driver) 10 in response to the DATA input.

PROBLEMS

There are several problems with the simple output driver. First, there typically are large voltage bounces occurring on output line 18 as a result of switching output signal from high to low or visa versa. These voltage bounces can have a devastating effects any circuitry receiving inputs from the output driver.

Second, there is the possibility of having the high and low drivers to be activated simultaneously; even for a fraction of a microsecond with a fraction of a milliamp. In other words, there would be a short between the two power rails Vcc and ground. If this brief current crossing were allowed, major problems might occur all over the IC chip. Specifically, just to name a few, the essential refreshing of the bits of memory on the chips might be interrupted, or large portions the logic calculations, performed by the chip might be disrupted thereby providing wrong solutions needed elsewhere in the computers operations.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the high speed output buffer with reduced voltage bounce and no cross current. Particularly, there is an output buffer which reduces the amount of voltage bounce occurring during the switching of the outputted signal. Uniquely, there is an output buffer/driver which turns on either driver transistor by progressively increasing the voltage on the control gates in a series of steps. Additionally, and simultaneously, the complementary signal is turned off immediately to prevent any possibility of creating current crossing in the output driver.

Other features and advantages of the present invention may become more clear from the following detailed description of the invention, taken in conjunction with the accompanying drawings and claims, or may be learned by the practice of the invention.

Figure 1:
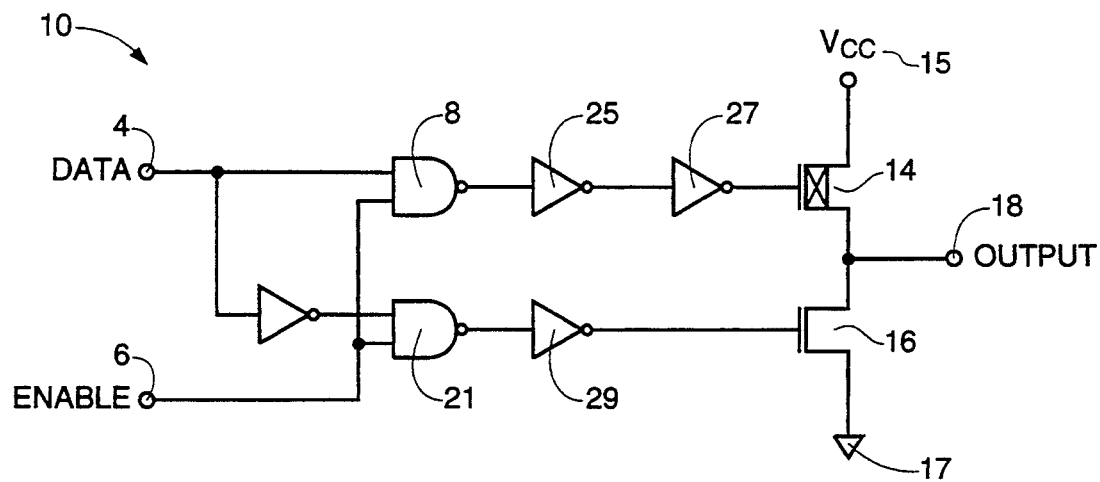
FIG. 1 is an electrical schematic of a related art output driver circuit.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

Figure 2:
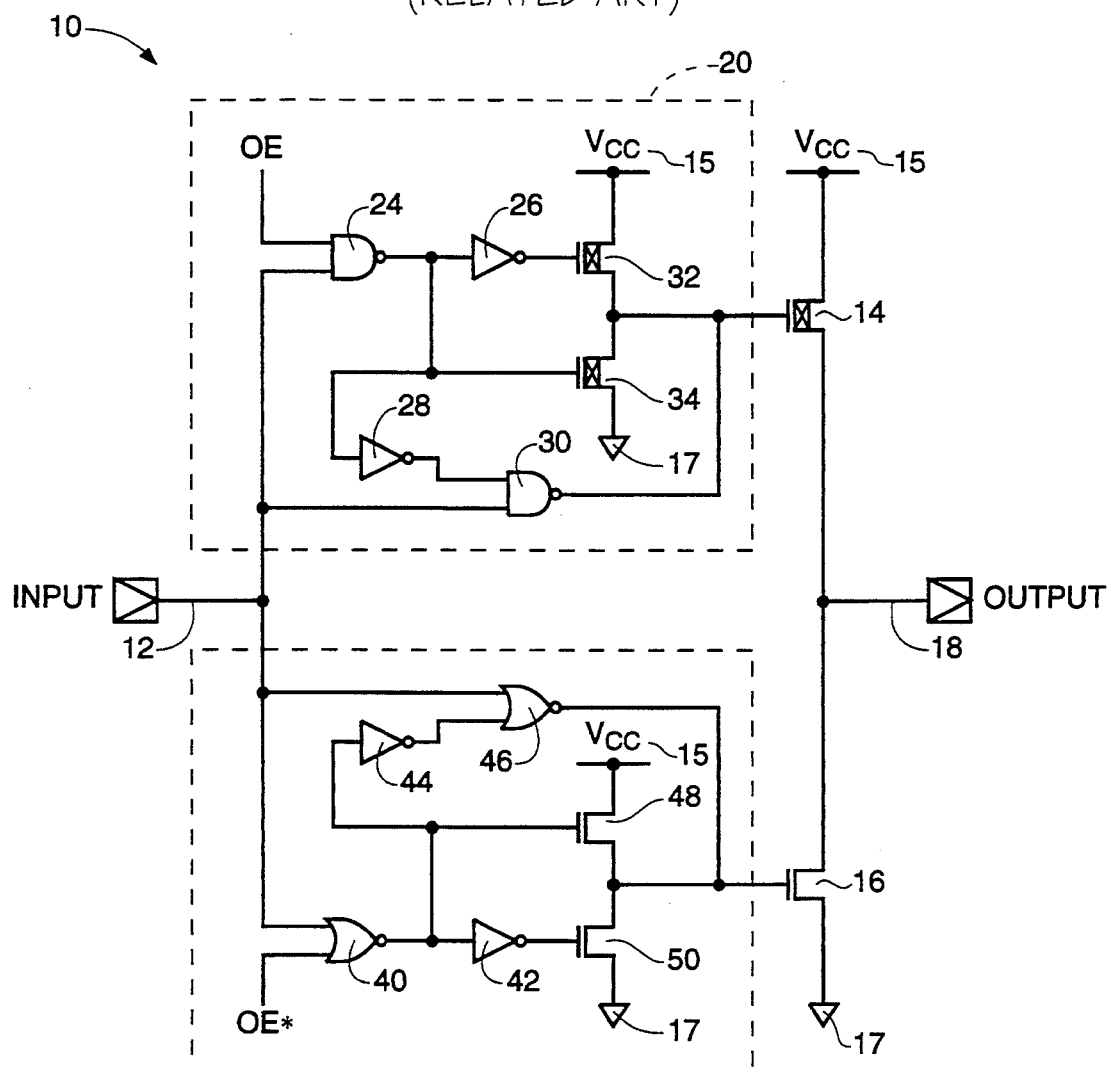
FIG. 2 is an electrical schematic of the new output driver circuit.

Referring now to FIG. 2, the electrical schematic of the preferred embodiment of the invention has the following additional elements over the circuit depicted in the schematic of FIG. 1. There are two approximately mirror image circuits designed to gradually turn on either of the gates of the output driver transistors 14, or 16. Simultaneously, there is circuitry that will immediately turn off the complementary transistor (14 or 16). Specifically, there is a p-channel gate control circuit 20, and an N-channel gate control circuit 22.

Concerning circuit 20, there are the following elements: There is a NAND gate 24, having inputs from OE (output enable) and the input line 12. There are two inverters 26 and 28 receiving inputs from NAND 24. A second NAND logic circuit 30 has inputs from inverter 28 and input line 12. There is a p-channel transistor 32, having its gate coupled to the output of inverter 26, its drain coupled to the gate of transistor 14, and its source coupled to Vcc. There is another p-channel transistor 34, having its gate coupled to the output of NAND 24, its source coupled to the drain of transistor 32 and the gate of transistor 14, and its drain coupled to ground. The gate of transistor 14 is also coupled to the output of NAND gate 30.

The N-channel gate control circuit 22 is roughly a mirror image of the P-channel gate control circuit 20, namely having the following elements: There is a first NOR gate 40, having inputs from the input line 12 and OE* (output enable star to indicate the opposite signal of OE). There are two inverters, 42 and 44, coupled to the output of NOR gate 40. A second NOR gate 46, has inputs from the input line 12 and inverter 44. There is an n-channel transistor 48, having its gate coupled to the output of NOR gate 40, its drain coupled to Vcc, and its source coupled to the gate of driver transistor 16. There is another n-channel transistor 50, having its gate coupled to the output of inverter 42, its source coupled to ground, and its drain coupled to the gate of driver transistor 16 and the source of transistor 48. NOR gate 46 also has its output coupled to the gate of driver transistor 16.

OPERATION OF THE INVENTION

It will be noted that there are now three pathways from the input line 12 to either driver transistor 14 or 16. Additionally, the three pathways of circuitry 20 and 22 are similar. Therefore, for illustrative purposes only the three signal paths in circuit 20 will be described for turning on transistor 14.

A first gate control circuit path, being the shortest in time because it has the least gate delays, begins at input line 12 and leads to the transistor gate 14 via NAND 24 and transistor 34. The second gate control circuit path, being the second fastest path, connects to transistor 14 via NAND 24 inverter 26 and transistor 32. The third gate control circuit path, being the slowest signal path to transistor gate 14, proceeds through NAND 24, inverter 28, and NAND 30.

As a result, one skilled in the art will realize that the incoming relatively weak current input signal on line 12 will produce a gradually increasing higher current output signal on line 18 as a result of the three gate control circuit paths. Specifically, during an input transition from low to high, the first gate control circuit path will activate transistor 34, thereby providing a first voltage level on the gate of transistor 14 that is less than $V_{cc}$, as transistor 32 is still conductive. This first gate control signal will result in the small increase of current in line 18. Similarly, the second gate control circuit path, during an input transition from low to high, will render transistor 32 nonconductive, thus providing a gate voltage equal to a threshold voltage above ground potential. This second voltage level is lower than the first, and thereby results in an increase of current output onto output line 18. Finally, during an input transition from low to high, the third gate control circuit path is the last to affect the gate voltage on transistor 34, providing a full ground potential and providing maximum current through transistor 34. This third voltage level will allow for the largest amount of current to be output over output line 18.

Therefore, a skilled artisan will understand that the current output on line 18 will slowly increase in relation to the timing from receiving the three gate control signals. Similarly, this same pattern takes place for driver transistor 16.

REMARKS ABOUT THE INVENTION

A skilled practitioner will realize that each of the three paths have a different number of gate delays to pass through before reaching the control gate of driver transistor 14. Thus, these three paths will work to turn on the selected gate in three progressively increasing stages. Meanwhile, and occurring before transistor 14 is beginning to be activated, driver transistor 16 will be immediately turned off by the fastest of the three circuit paths leading to it. Although the functioning of the gate control circuitry was described for only a low to high input transition, the function of the circuitry for a high to low transition is similar and should be apparent to those of ordinary skill in the art.

It is noted that because of the three time differentiated paths to the gates of the driver transistors 14 or 16, voltage bounce is significantly reduced. Specifically, by slowing down the turn on period, and gradually increasing the voltage in several stages to turn on the gate, there is much less bounce.

It is further noted that there is little opportunity for the output current on line 18 to cross with the present circuitry. Each of the output driver transistors 14, and 16 will be disabled when the first signal from the quickest—least gate delays—path reaches the control gate of 14 or 16. Meanwhile, it takes all three speed paths to turn on the complement transistor (14 or 16). Thus taking longer to turn on than to turn off the transistor.

In the appended claims, transistor 32 is referred to as a P-channel pull-up transistor, transistor 34, as a P-channel pull-down transistor, transistor 48 as an N-channel pull-up transistor, and transistor 50 as an N-channel pull-down transistor.

VARIATIONS IN THE INVENTION

There are obvious variations to the broad invention and thus come within the scope of the present invention, in which a few are herein discussed. Uniquely, this invention may work with any number of circuit paths from input line 12 to the gates of transistors 14 or 16. Even though, the current embodiment discussed only three (3) circuit pathways for each gate, any number will work. Of course this will depend upon how precisely the voltage bounce on the output line 18 needs to be controlled, and how sensitive the circuitry is to the resultant slowing of the circuitry as a result of the increased gate delays.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Patent is:

1. An IC output driver device, comprising:
   an output line;
   a power supply bus;
   a ground bus;
   an input line;
   a P-channel driver transistor, having its source coupled to the power supply bus and its drain coupled to the output line, for amplifying a logic high output signal, having circuitry coupled to the gate of the P-channel driver transistor for controlling a output current bounce on the output line, including:
   an output enable signal line;
   a first NAND gate, having first and second inputs, the first input being coupled to the input line and the second input being coupled to the output enable signal line;
   first and second inverters, each inverter receiving an input from the first NAND gate;
   a second NAND gate having first and second inputs, the first input being coupled to the output of the second inverter and the second input being coupled to the input line;

a P-channel pull-up transistor, having its gate coupled to the output of the first inverter, its drain coupled to the gate of the P-channel driver transistor, and its source coupled to the power supply bus;

a P-channel pull-down transistor having its gate coupled to the output of the first NAND, its source coupled to the drain of the P-channel pull-up transistor and the gate of the P-channel driver transistor, and its drain coupled to the ground bus; and the gate of the P-channel driver transistor coupled to the output of the second NAND gate.

2. The IC driver device of claim 1, further comprising:

an N-channel driver transistor, having its drain coupled to the output line and the drain of the P-channel driver transistor, and its source coupled to the ground bus, for amplifying the output of a logic low signal, having circuitry coupled to the gate of the N-channel driver transistor for controlling current bounce on the output line, including:

a complement output enable signal line;

a first NOR gate, said first NOR gate having first and second inputs, the first input being coupled to the input line and the second input being coupled to the complement output enable signal line;

third and fourth inverters, each having an input coupled to the output of the first NOR gate;

a second NOR gate, having first and second inputs, the first input being coupled to the input line and the second input being coupled to the output of said fourth inverter;

an N-channel pull-up transistor, having its gate coupled to the output of the first NOR gate, its drain coupled to the power supply bus, and its source coupled to the gate of the N-channel driver transistor;

an N-channel pull-down transistor, having its gate coupled to the output of the third inverter, its source coupled to the ground bus, and its drain coupled to the gate of the N-channel driver transistor and to the source of the N-channel pull-up transistor; and said second NOR gate having its output coupled to the gate of the N-channel driver transistor.

3. A non-inverting output driver circuit comprising:
an input node;
an output node;
a P-channel insulated-gate, field-effect driver transistor having a gate, and a channel which couples the output node to a power supply bus;
gate control circuitry for the P-channel driver transistor including;
    a P-channel insulated-gate, field-effect pull-up transistor having a gate, and a channel which couples the power supply bus to the gate of the P-channel driver transistor;
    a P-channel insulated-gate, field-effect pull-down transistor having a gate, and a channel which couples the ground bus to the gate of the P-channel driver transistor;
    a first NAND gate having an output coupled to the P-channel pull-down transistor, a first input for receiving an output enable signal, and a second input coupled to the input node;
    a first inverter having an input coupled to the output of said first NAND gate, and also having an output coupled to the gate of the P-channel pull-up transistor;
    a second inverter having an output, and also having an input coupled to the output of said first NAND gate;
    a second NAND gate having an output coupled to the gate of the P-channel driver transistor, a first input coupled to the output of said second inverter, and a second input coupled to the input node;
an N-channel insulated-gate, field-effect driver transistor having a gate, and a channel which couples the output node to a ground bus;
gate control circuitry for the N-channel driver transistor including;
    an N-channel insulated-gate, field-effect pull-up transistor having a gate, and a channel which couples the power supply bus to the gate of the N-channel driver transistor;
    an N-channel insulated-gate, field-effect pull-down transistor having a gate, and a channel which couples the ground bus to the gate of the N-channel driver transistor;
    a first NOR gate having an output coupled to the gate of the N-channel pull-up transistor, a first input for receiving a complement of the output enable signal, and a second input coupled to the input node;
    a third inverter having an input coupled to the output of said first NOR gate, and also having an output coupled to the gate of the N-channel pull-down transistor;
    a fourth inverter having an input coupled to the output of said first NOR gate, and also having an output; and
    a second NOR gate having an output coupled to the gate of the N-channel driver transistor, a first input coupled to the output of said fourth inverter, and a second input coupled to the input node.

4. A non-inverting output driver circuit comprising:
an input node;
an output node;
a P-channel insulated-gate, field-effect driver transistor having a gate, and a channel which couples the output node to a power supply bus;
gate control circuitry for the P-channel driver transistor including;
    a P-channel insulated-gate, field-effect pull-up transistor having a gate, and a channel which couples the power supply bus to the gate of the P-channel driver transistor;
    a P-channel insulated-gate, field-effect pull-down transistor having a gate, and a channel which couples the ground bus to the gate of the P-channel driver transistor;
    first and second NAND gates, each having first and second inputs and an output;
        the first input of said first NAND gate coupled to an output enable signal, the second input of said first NAND gate being coupled to the input node, the second input of said second NAND gate being coupled to the input node, the output of said second NAND gate being coupled to the gate of the P-channel driver transistor, the output of said first NAND gate being directly coupled to the P-channel pull-down transistor and indirectly coupled to both the P-channel pull-up transistor and the first input of said second NAND gate through an inverter;

an N-channel insulated-gate, field-effect driver transistor having a gate, and a channel which couples the output node to a ground bus;

gate control circuitry for the N-channel driver transistor including;

an N-channel insulated-gate, field-effect pull-up transistor having a gate, and a channel which couples the power supply bus to the gate of the N-channel driver transistor;

an N-channel insulated-gate, field-effect pull-down transistor having a gate, and a channel which couples the ground bus to the gate of the N-channel driver transistor;

first and second NOR gates, each having first and second inputs and an output;

the first input of said first NOR gate coupled to a complement of the output enable signal, the second input of said first NOR gate being coupled to the input node, the second input of said second NOR gate being coupled to the input node, the output of said second NOR gate being coupled to the gate of the P-channel driver transistor, the output of said first NOR gate being directly coupled to the N-channel pull-up transistor and indirectly coupled to both the N-channel pull-down transistor and the first input of said second NOR gate through an inverter.

5. A non-inverting output driver circuit comprising:
an input node;
an output node;
a P-channel insulated-gate, field-effect driver transistor having a gate, and a channel which couples the output node to a power supply bus, said P-channel driver transistor having control circuitry coupled to its gate;

an N-channel insulated-gate, field-effect driver transistor having a gate, and a channel which couples the output node to a ground bus, said N-channel driver transistor having control circuitry coupled to its gate;

the gate control circuitry for said P-channel driver transistor operative to deactivate said P-channel driver transistor before said N-channel driver transistor is activated by its gate control circuitry, the gate control circuitry for said P-channel driver transistor comprising:

a NAND gate having an output coupled to the gate of said P-channel driver transistor, a first input coupled to said input node via a first path, a second input coupled to said input node via a second path, said first path being electrically shorter than said second path;

a P-channel pull-up transistor having a gate coupled to said input node via a fifth path, and a channel which couples the power supply bus to the gate of said P-channel driver transistor;

a P-channel pull-down transistor having a gate coupled to said input node via a sixth path, and a channel which couples the ground bus to the gate of said P-channel driver transistor, said sixth path being electrically shorter than said fifth path; and the gate control circuitry for said N-channel driver transistor operative to deactivate said N-channel driver transistor before said P-channel driver transistor is activated by its gate control circuitry, the gate control circuitry for said N-channel driver transistor comprising:

a NOR gate having an output coupled to the gate of said N-channel driver transistor, a first input coupled to said input node via a third path, and a second input coupled to said input node via a fourth path, said third path being electrically shorter than said fourth path;

an N-channel pull-up transistor having a gate coupled to said input node via a seventh path, and a channel which couples the power supply bus to the gate of said N-channel driver transistor;

an N-channel pull-down transistor having a gate coupled to said input node via an eighth path, and a channel which couples the ground bus to the gate of said N-channel driver transistor, said seventh path being electrically shorter than said eighth path.

6. The non-inverting output driver circuit of claim 5, wherein said second and fourth paths each contain at least two more gate delays than said first and third paths, respectively.

7. The non-inverting output driver circuit of claim 6, wherein an inverter is utilized to provide an additional gate delay in each of said second and fourth paths.

8. The non-inverting output driver circuit of claim 5, wherein said fifth and eighth paths each contain at least one more gate delay than said sixth and seventh paths, respectively.

9. The non-inverting output driver circuit of claim 8, wherein inverters are utilized to provide a gate delays.

* * * * *